United States Patent [19]

Lin

[11] Patent Number: 5,638,258
[45] Date of Patent: Jun. 10, 1997

[54] CPU HEAT SINK FASTENER

[76] Inventor: Jen-Cheng Lin, 6F, No. 62, Chang Hsin Rd., Taipei, Taiwan

[21] Appl. No.: 547,364

[22] Filed: Oct. 24, 1995

[51] Int. Cl.$^6$ .................................................. H05K 7/20
[52] U.S. Cl. .......................... 361/704; 165/80.3; 174/16.3; 257/727
[58] Field of Search .......................... 24/295, 457, 458, 24/493, 494, 495, 498, 505, 510, 513, 517, 518, 535–538; 411/352, 516, 520, 522; 174/16.3; 257/706, 707, 719, 727; 165/80.3, 185; 267/150, 160; 248/316.7, 505, 510; 361/717–719, 722, 704, 709, 710

[56] References Cited

U.S. PATENT DOCUMENTS 5,448,449  9/1995  Bright ...................................... 361/704
5,486,981  1/1996  Blomquist ............................... 361/704
5,542,468  8/1996  Lin .......................................... 165/80.3

*Primary Examiner*—Gerald P. Tolin
*Attorney, Agent, or Firm*—Bacon & Thomas

[57] ABSTRACT

A CPU heat sink fastener for fastening a CPU heat sink to a CPU mount to hold down a CPU between said CPU heat sink and said CPU mount, including a pressure bar having a mounting hole at one end fastened to a first rod at one side of the CPU mount, an actuating lever pivoted to one end of the pressure bar, and a clamping bar pivoted to the actuating lever and having a mounting hole fastened to a second rod at an opposite side of the CPU mount, wherein the CPU heat sink fastener is secured to the CPU mount to hold down the CPU heat sink and the CPU when the actuating lever is turned to one side; the CPU heat sink fastener is released from the CPU mount when the actuating lever is turned to an opposite side.

4 Claims, 3 Drawing Sheets

CPU HEAT SINK FASTENER

BACKGROUND OF THE INVENTION

The present invention relates to a CPU heat sink fastener for securing a CPU heat sink to a CPU.

When a computer is in operation, the CPU will produce heat, and the heat must be quickly carried away so that the operation of the CPU can be maintained normal. Various heat dissipating devices have been developed for this purpose. German Patent No. 29500423.1 which is an invention of the present inventor, discloses a CPU heat dissipating device which comprises a mount mounted on the CPU of a computer mainframe for carrying a heat sink, the mount having a center screw hole, and a plurality of downward mounting rods respectively terminating in a respective hooked portion for fastening to the CPU, and a heat sink mounted on the mount for dissipating of heat, the heat sink having a stub bottom screw rod threaded into the screw hole. This structure of CPU heat dissipating device is functional, however it still has drawbacks. One drawback of this structure of CPU heat dissipating device is its complicated installation procedure. Another drawback of this structure of CPU heat dissipating device is that the downward mounting rods tend to be damaged when the mount is disconnected from the CPU. Furthermore, this top loading CPU heat dissipating device has only a narrow application range. If the thickness of the CPU surpasses a predetermined range, the device become unable to be installed.

SUMMARY OF THE INVENTION

The present invention has been accomplished to provide a CPU heat sink fastener which can be conveniently fastened to a CPU mount to hold down a CPU heat sink and a CPU. According to the present invention, the CPU heat sink fastener consists of a pressure bar, an actuating bar pivoted to the pressure bar, and a clamping bar pivoted to the pressure bar and turned between the locking position and the unlocking position by the actuating lever.

DETAILED DESCRIPTION OF THE PREFERRED EMBODIMENTS

Figure 1:
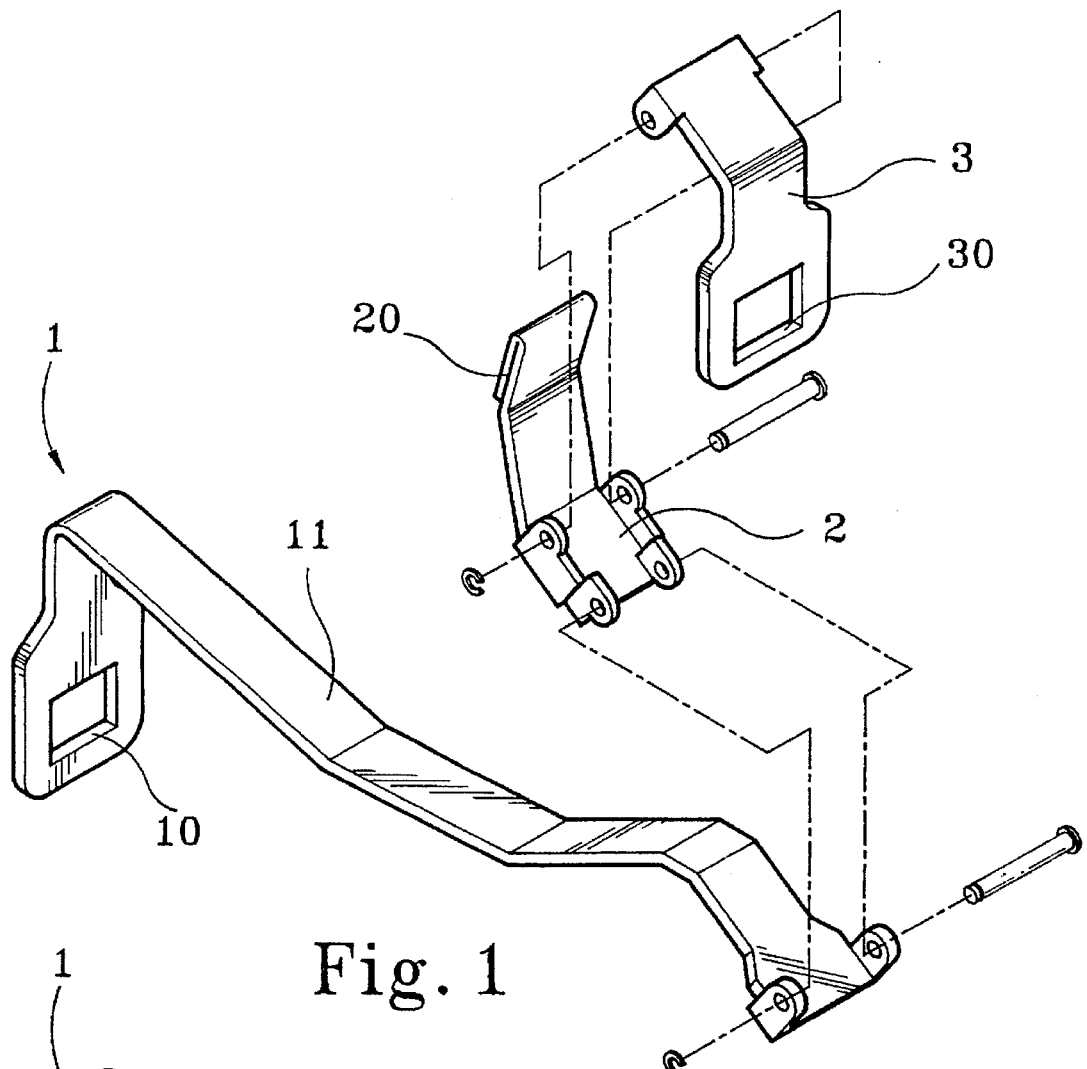
FIG. 1 is an exploded view of a fastener according to the present invention.
Figure 2:
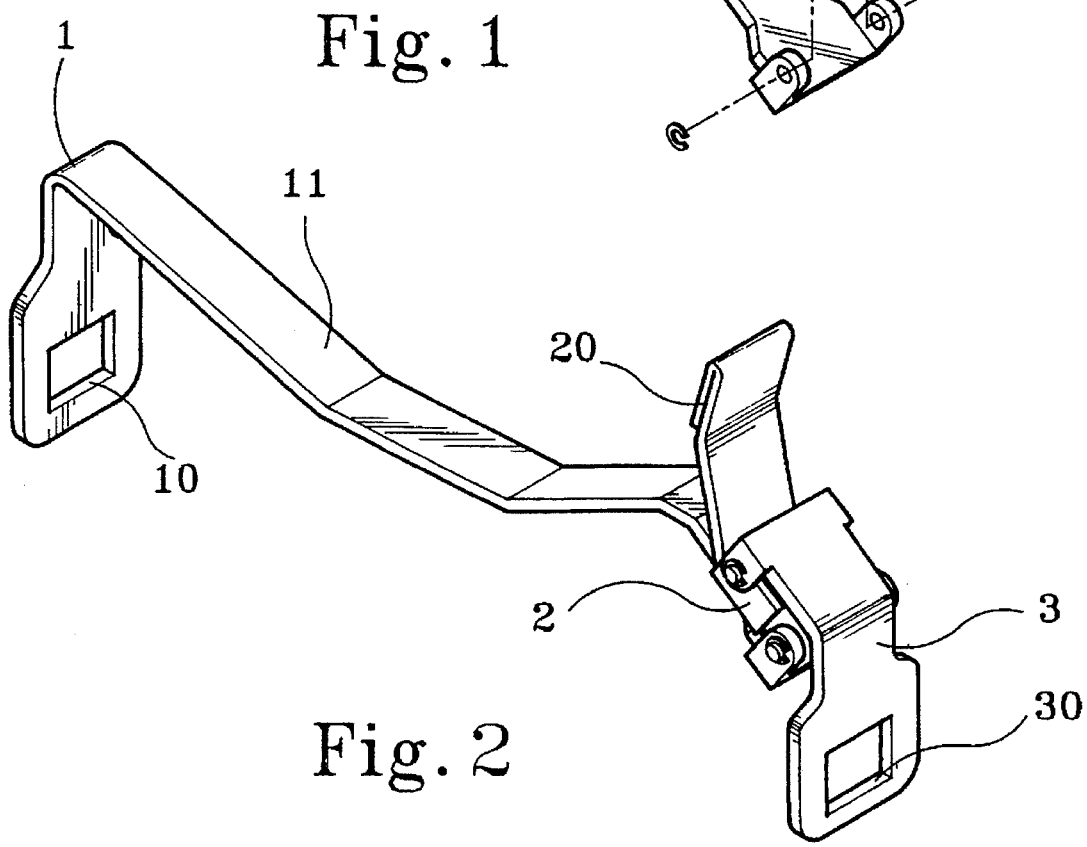
FIG. 2 is an elevational view of the fastener shown in FIG. 1.

Referring to FIGS. 1 and 2, a CPU heat sink fastener in accordance with the present invention is generally comprised of a pressure bar 1, a clamping bar 3, and an actuating lever 2. The pressure bar 1 comprises a downwardly curved pressure portion 11 having one end pivoted to the clamping bar 3 and the actuating lever 2 and an opposite end terminating in mounting hole 10 for fastening to a first rod 90 at one side of the CPU mount, referenced by 9 (see also FIG. 3A). The actuating lever 2 has one end pivoted to one end of the curved pressure portion 11, and an opposite end terminating in a handhold portion 20. The clamping bar 3 has one end pivoted to the actuating lever 2, and an opposite end terminating in a mounting hole 30 for fastening to a second rod 90' at an opposite side of the CPU mount 9.

Figure 3A:
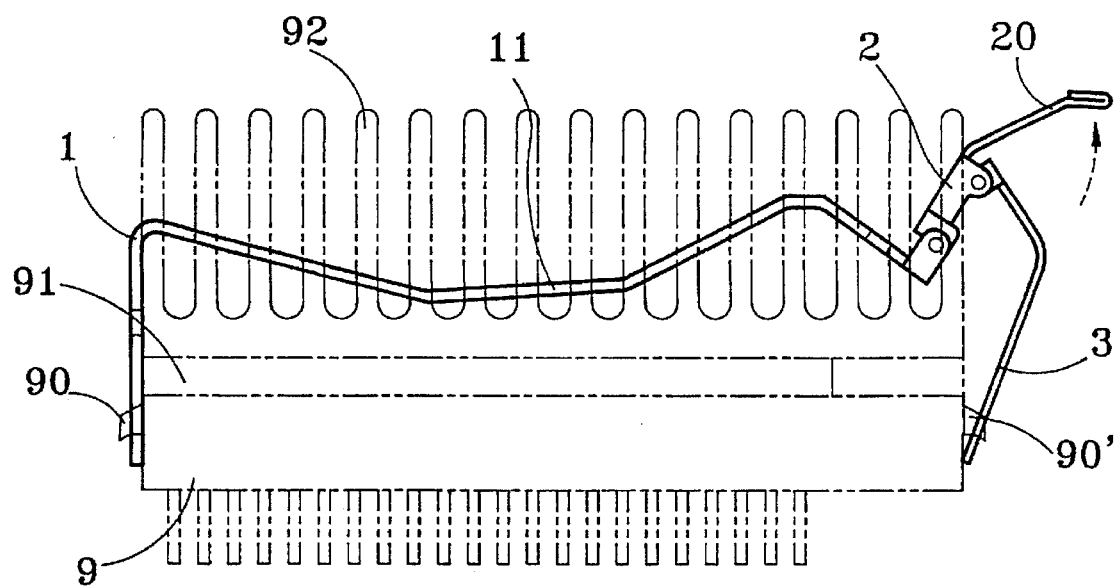
FIG. 3A, 3B, and 3C are continuous drawings showing the installation of the fastener according to the present invention.
Figure 3B:
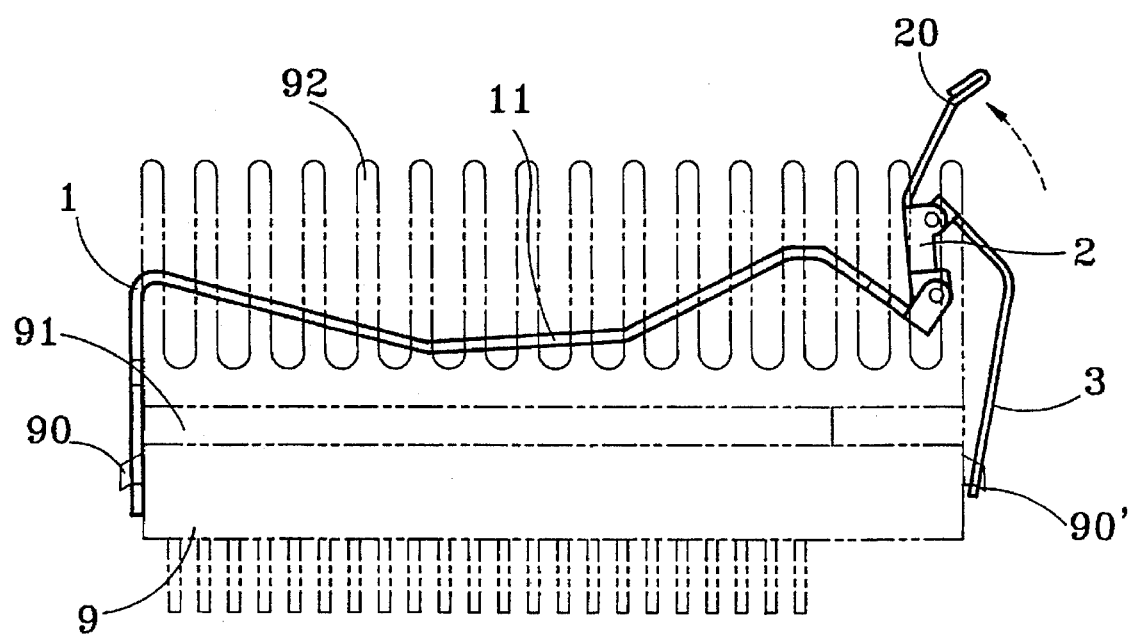
Figure 3C:
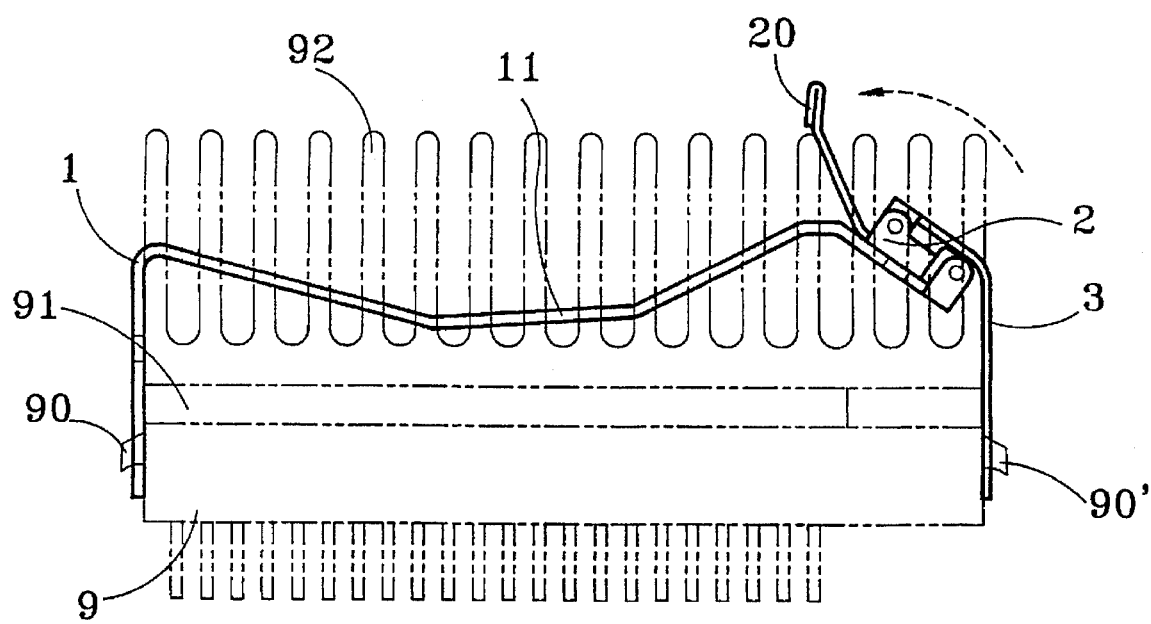

Referring to FIGS. 3A, 3B, and 3C, when a CPU heat sink 92 is attached to a CPU 91 on a CPU mount 9, the fastener is mounted on the CPU heat sink 92 with the mounting hole 10 of the pressure bar 1 and the mounting hole 30 of the clamping bar 3 respectively sleeved onto the first rod 90 and the second rod 90' (see FIG. 3A), then the actuating lever 2 is turned backwardly outwards from the clamping bar 3 (see FIG. 3B) to the locking position (see FIG. 3C). When the actuating lever 2 is turned to the locking position, the combined length of the pressure bar 1 and the clamping bar 3 is reduced to the shortest condition, and the CPU heat sink fastener is arranged into a substantially U-shaped configuration, and therefore the CPU heat sink 92 is firmly retained to the CPU mount 9 to hold down the CPU 91 between the CPU heat sink 92 and the CPU mount 9. When the actuating lever 2 is turned in the reversed position from the locking position (see FIG. 3C) to the unlocking position (see FIG. 3A), the fastener can then be removed from the CPU mount 9 and the CPU heat sink 92.

Figure 4:
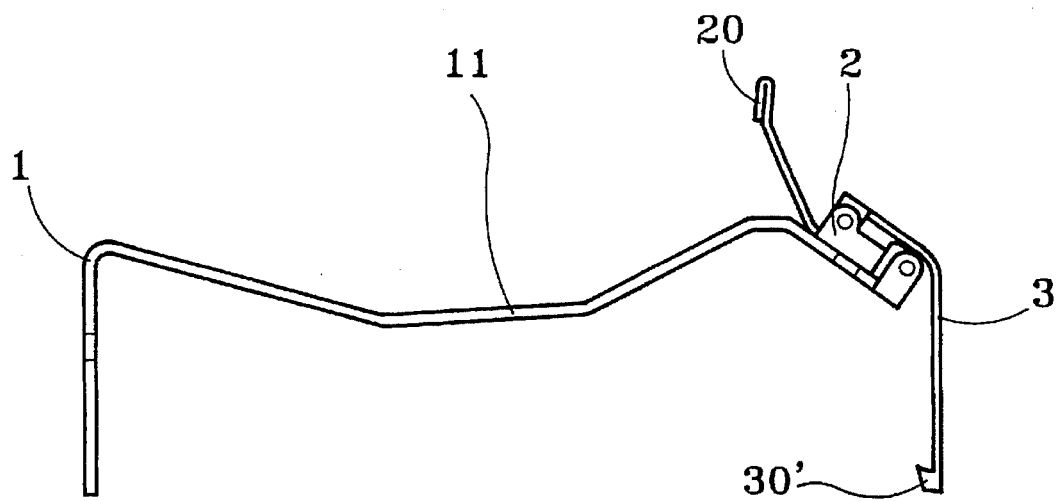
FIG. 4 shows an alternate form of the fastener according to the present invention.

FIG. 4 shows an alternate form of the present invention in which the clamping bar 3 has one end pivoted to the actuating lever 2, and an opposite end terminating in a hook 30' for fastening to the second rod 90' of the CPU mount 9.

I claim:

1. A CPU heat sink and fastener for a CPU mount having first and second opposite sides, comprising:

a) a heat sink having a plurality of upwardly extending heat dissipating elements having distal ends, said elements extending in a width direction of the sink to form a row; and b) a fastener engaging the CPU mount and the heat sink and fastening the heat sink to the CPU mount and comprising:

i. an elongated pressure bar extending in the width direction of the sink and having a width greater than its thickness, the pressure bar having a first end forming a first means attaching the first end to the first side of the CPU mount, and a second end;

ii. a clamping bar having second engagement means attaching the clamping bar to the second side of the CPU mount;

iii. an actuating lever pivotally connected to the second end of the pressure bar and to the clamping bar, so as to be movable between an open position and a locking position wherein the pressure bar urges the heat sink into contact with the CPU mount; and iv. a handhold extending from the actuating lever so as to move therewith between the open and locking positions such that the handhold extends upwardly beyond the distal ends of the heat dissipating elements when the actuating lever is in the locked position.

2. The CPU heat sink and fastener of claim 1 wherein the first engagement means comprises:

a. a rod extending from the first side of the CPU mount; and, b. a mounting hold formed in the first end of the pressure bar configured to engage the rod.

3. The CPU heat sink and fastener of claim 1 wherein the second engagement means comprises:

a. a rod extending from the second side of the CPU mount; and, b. a mounting hole formed in the clamping bar configured to engage the rod.

4. The CPU heat sink and fastener of claim 1 wherein the second engagement means comprises:

a. a rod extending from the second side of the CPU mount; and b. a hook on the clamping bar configured to engage the rod.

* * * * *